(12) United States Patent
Scott et al.

(10) Patent No.: US 8,410,814 B2
(45) Date of Patent: Apr. 2, 2013

(54) RECEIVER CIRCUITS FOR DIFFERENTIAL AND SINGLE-ENDED SIGNALS

(75) Inventors: Gregory S. Scott, Santa Clara, CA (US); Vincent R. von Kaenel, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/162,360

(22) Filed: Jun. 16, 2011

(65) Prior Publication Data
US 2012/0319781 A1    Dec. 20, 2012

(51) Int. Cl.
*H03K 17/16* (2006.01)
*H03K 19/003* (2006.01)

(52) U.S. Cl. .......................... 326/30; 326/83

(58) Field of Classification Search ................. None
See application file for complete search history.

(56) References Cited

U.S. PATENT DOCUMENTS

| | | | |
|---|---|---|---|
| 5,243,623 A | 9/1993 | Murdock | |
| 5,736,871 A | 4/1998 | Goto | |
| 5,910,730 A | 6/1999 | Sigal | |
| 6,046,621 A * | 4/2000 | Crowley | 327/333 |
| 6,317,369 B1 | 11/2001 | Kubo | |
| 6,433,627 B1 | 8/2002 | Ruesch | |
| 6,917,562 B2 | 7/2005 | Schaefer | |
| 7,023,238 B1 * | 4/2006 | Camarota | 326/38 |
| 7,030,665 B2 | 4/2006 | Takeuchi | |
| 7,091,741 B2 * | 8/2006 | Kim | 326/24 |
| 7,127,003 B2 | 10/2006 | Rajan et al. | |
| 7,288,980 B2 | 10/2007 | Lundberg | |
| 7,514,968 B1 | 4/2009 | Lai et al. | |
| 7,639,167 B2 | 12/2009 | Tsuchi | |
| 7,889,579 B2 | 2/2011 | Faue | |
| 7,961,007 B2 | 6/2011 | Scott et al. | |
| 2005/0046472 A1 | 3/2005 | Kim | |
| 2005/0162292 A1 * | 7/2005 | Kanekawa et al. | 341/111 |
| 2007/0079147 A1 | 4/2007 | Pyeon et al. | |
| 2008/0189457 A1 | 8/2008 | Dreps | |
| 2008/0279310 A1 | 11/2008 | Wu | |
| 2010/0279645 A1 * | 11/2010 | Scott et al. | 455/343.1 |

OTHER PUBLICATIONS

U.S. Appl. No. 13/115,824 entitled "Receiver Circuits for Differential and Single-Ended Signals;" filed May 25, 2011.
U.S. Appl. No. 13/100,630, entitled "Receiver to Match Delay for Single Ended and Differential Signals;" filed May 4, 2011.
International Search Report for PCT/US2010/031629 mailed on Oct. 15, 2010, 10 pages.

\* cited by examiner

*Primary Examiner* — Crystal L Hammond
(74) *Attorney, Agent, or Firm* — Lawrence J. Merkel; Meyertons, Hood, Kivlin, Kowert & Goetzel, P.C.

(57) ABSTRACT

Receiver circuits for differential and single-ended signals are disclosed. In some embodiments, a receiver may include a first amplifier configured to receive a first signal of a differential pair of signals at a first input and a second signal of the differential pair of signals at a second input when operating in differential mode. The receiver may also include a second amplifier coupled to the first amplifier, where the second amplifier is configured to receive a reference signal at a third input and a single-ended signal at the first input when operating in single-ended mode. In some embodiments, several receivers may be used, for example, to process a differential clock signal and one or more single-ended data signals referenced to the clock signal and/or differential data signals referenced to a single-ended clock signal. In some embodiments, the delays of each signal propagating through each respective receiver may be independently adjusted.

20 Claims, 5 Drawing Sheets

RECEIVER CIRCUITS FOR DIFFERENTIAL AND SINGLE-ENDED SIGNALS

BACKGROUND

1. Field of the Invention

This invention is related to the field of integrated circuits and, more particularly, to receiver circuits.

2. Description of the Related Art

Integrated circuits (ICs) generally include a core circuit that implements the various operations that the IC is designed to perform, a driver circuit that drives output signals from the core circuit to an external circuit, and a receiver circuit that receives input signals from the external circuit and provides the received signals to the core circuit. The driver and receiver circuitry buffer and isolate the core circuit from the external circuit, thus handling the larger loads, higher current flows, higher voltages, noise, etc. that are typically involved in external communications.

Some ICs are configured to receive "singled-ended" signals—that is, signals that are generated relative to a fixed reference voltage and transmitted over a single wire. Other ICs are configured to receive "differential" signals—that is, two complementary signals transmitted over two separate wires. Differential signaling is particularly well suited for use in high speed IC interfaces due to its improved power characteristics and noise immunity. In certain situations, however, it may be desirable for an IC to handle both single-ended and differential signals.

For example, the mobile double data rate 2 (mDDR2) memory interface (sometimes referred to as the low power DDR2 or LPDDR2 interface) permits single-ended data signaling with a differential clock and vice-versa. Configurations that use only differential or only single-ended signaling are also supported. Because a data signal is normally referenced with respect to a clock signal, an IC that receives these types of signals may have to account for timing differences between its differential and single-ended inputs.

SUMMARY

Receiver circuits for differential and single-ended signals are disclosed. In an embodiment, a receiver circuit may operate in differential or single-ended mode. For example, a receiver circuit may include a first amplifier configured to receive a first signal of a differential pair of signals at a first input and a second signal of the differential pair of signals at a second input when the receiver is operating in differential mode. The receiver may also include a second amplifier coupled to the first amplifier, where the second amplifier is configured to receive a reference signal at a third input and a single-ended signal at the first input when the receiver is operating in single-ended mode.

In some embodiments, two or more receivers may be used, for example, to simultaneously process a differential clock signal and one or more single-ended data signals referenced to the clock signal. Additionally or alternatively, the two or more receivers may simultaneously process differential data signals referenced to a single-ended clock signal. In certain embodiments, the delays of each different type of signal propagating through each respective receiver may be independently adjusted or controlled. For example, the output of the differential amplifier and the output of the single-ended amplifier in each receiver circuit may be coupled to a respective inverter. Moreover, the delays of these various signals may be synchronized, for example, by setting the beta ratios of each individual inverter as needed.

In other embodiments, a method may include configuring a first receiver circuit of the plurality of receiver circuits for differential operation, where the first signal is one of a differential pair representing the input to the first receiver circuit. The method may also include configuring a second receiver circuit of the plurality of receiver circuits for single-ended mode, where the first signal is the single-ended input to the second receiver circuit and the second receiver circuit is further coupled to receive a reference voltage to which the single-ended input is referenced. The method may further include setting a first delay of the differential pair through the first receiver circuit is approximately the same as a second delay of the single-ended input through the second receiver circuit or vice-versa.

BRIEF DESCRIPTION OF THE DRAWINGS

The following detailed description makes reference to the accompanying drawings, which are now briefly described.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, ¶6 interpretation for that unit/circuit/component.

DETAILED DESCRIPTION OF EMBODIMENTS

Overview

Figure 1:
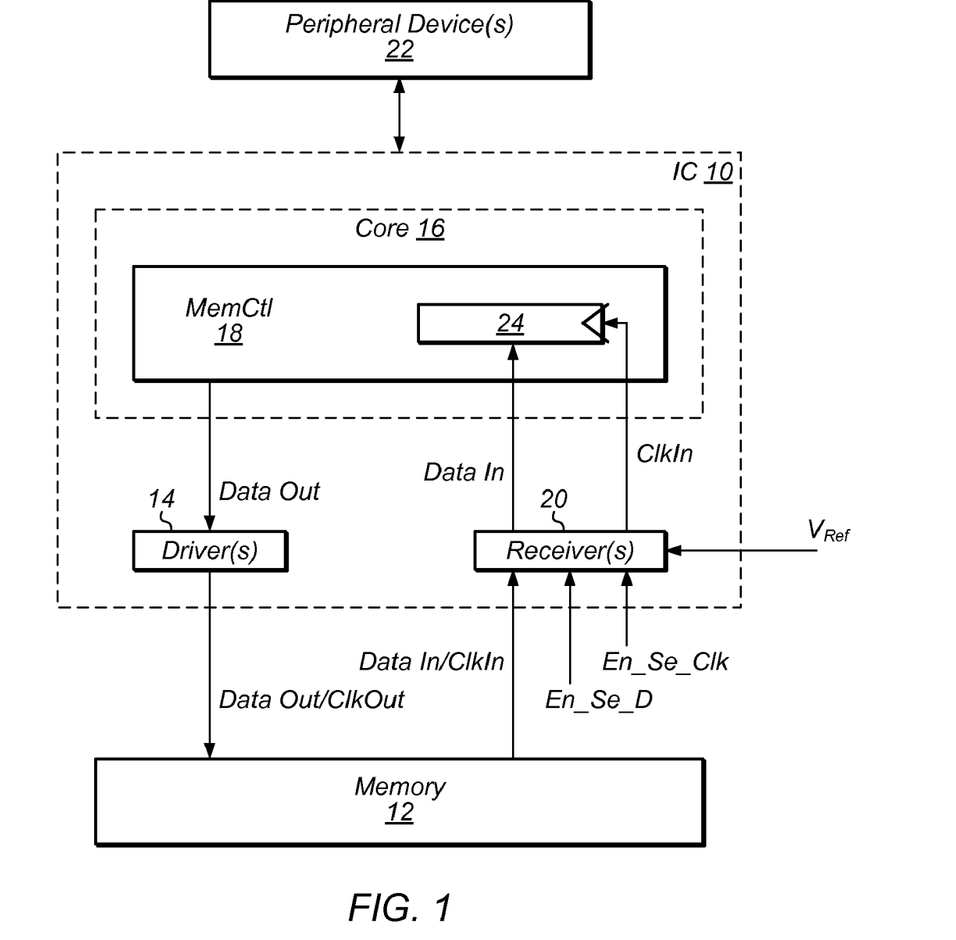
FIG. 1 is a block diagram of an integrated circuit according to some embodiments.

Turning to FIG. 1, a block diagram of integrated circuit (IC) 10 is depicted according to some embodiments. As illustrated, integrated circuit 10 is coupled to memory 12 and to peripheral devices 22.

Specifically, with respect to memory 12, integrated circuit 10 may be coupled via one or more conductors forming an output channel and one or more other conductors forming an input channel. Together, the output channel and the input channel of IC 10 may form an interface to the memory. For example, in an embodiment, memory 12 and the interface may be compliant with the mDDR2 specification. In that specification, each of the input and output channels is formed from one or more data inputs/outputs that are referenced to a clock transmitted by the source of the data. That is, data is sampled from the conductors by the receiving device using the transmitted clock. Accordingly, as shown in FIG. 1, the output channel may comprise one or more data outputs (Data Out) and at least one clock output (ClkOut). Similarly, the input channel may comprise one or more data inputs (Data In) and at least one clock input (ClkIn) In some embodiments, more than one ClkOut or ClkIn may be provided. The data outputs/inputs may be divided into groups referenced to different ones of the ClkOut outputs or ClkIn inputs. In some cases, such an arrangement may ease the skew management in the transmitter between the data and the corresponding clock.

The mDDR2 specification, for instance, permits mixtures of single-ended data inputs and different clock inputs and vice-versa (and also permits the same mixtures for data and clock outputs). Accordingly, in various implementations, a given input may be a single conductor (referenced to a voltage reference $V_{Ref}$ for determining high or low on the single conductor, in the illustrated embodiment) or a pair of conductors on which a differential pair of signals is carried.

Generally, single-ended inputs may be inputs that are represented by a single signal that is referenced to a reference voltage ($V_{Ref}$). If the signal voltage is above $V_{Ref}$, the signal is carrying a logical one. If the signal voltage is below $V_{Ref}$, the signal is carrying a logical zero. On the other hand, differential inputs may be inputs that are represented by a differential pair of signals. These differential signals may be complementary, and thus a transition toward high on one signal is accompanied by a transition toward low on the other signal. One of the signals may be associated with the true value of the input, and the other may be associated with the complement of the input (or the inverse of the input). The input may be sensed as the difference between the true and complementary signals. In various embodiments, differential pairs may permit higher speed signaling, lower power signaling, and/or more immunity to noise on the conductors. Accordingly, a generic reference to an "input" may refer to either a single-ended or differential input. A reference to an "input signal" may refer to the single input signal of a single-ended input or one of the differential pair of signals for a differential input, for example. A similar discussion applies to the outputs described herein.

Integrated circuit 10 includes a set of driver circuits 14 configured to drive the output channel to memory 12, and a set of receiver circuits ("receivers") 20 configured to receive the input channel from memory 12. Integrated circuit 10 further includes core circuitry 16, which includes memory controller (MemCtl) 18 configured to control memory 12. Memory controller 18 is configured to transmit data out to drivers 14, which may transmit the data on the Data Out outputs, referenced to the ClkOut output. In other embodiments, memory controller 18 may also provide the output clock, and driver circuits 14 may drive the ClkOut output from the output clock. In an embodiment, the output channel may carry packets of data, which may include commands (e.g., read and write commands to the memory) as well as data (e.g., write data for a memory write command). Similarly, the input channel may carry packets of data, including read data for a memory read command. Other embodiments may have explicit address, control, and data outputs, and data inputs.

Figure 2:
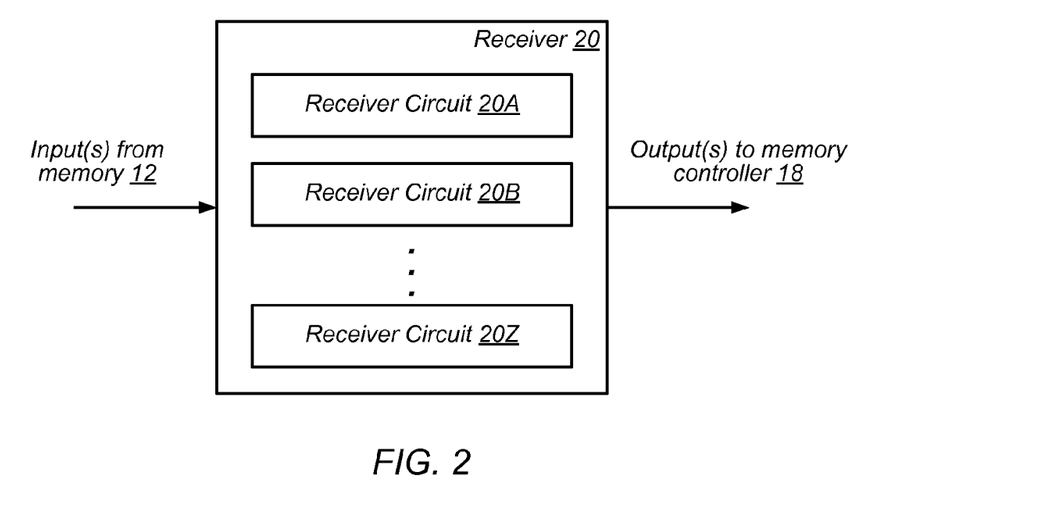
FIG. 2 is a block diagram of a receiver according to some embodiments.

As shown in FIG. 2, receiver 20 may be configured to receive inputs (e.g., Data In and ClkIn) from memory 12 and to provide those received inputs to memory controller 18. Receiver 20 may convert such inputs to internal digital signals. For single-ended inputs, the conversion may include generating a sharper transition and possibly level shifting to the voltage domain of memory controller 18. Alternatively, level shifting may be performed within memory controller 18. For differential inputs, the conversion may include recovering a digital signal from a differential pair. Each of these differential or single-ended signals may be processed by an individual one of receiver circuits 20A-Z.

As described in more detail below, receiver circuits 20A-Z within receiver 20 may receive one or more enable signals, which indicate whether the corresponding input is single-ended or differential. For example, as illustrated, a single enable signal may be asserted to indicate single-ended operation and de-asserted to indicate differential operation. Other enable signals may be defined in the opposite fashion. Further, two distinct enable signals may be used for each respective mode of operation. Generally, an enable signal may be considered to be asserted in either the high state or the low state, and deasserted in the other state.

In an embodiment, data inputs may be defined to be single-ended or differential as a group, and thus there may be an enable for the entire group of data signals (En_Se_D in FIG. 1), for example. In that case, those circuits within receiver 20 that are coupled to receive data inputs may receive the En_Se_D signal. On the other hand, the clock signal(s) may be separately indicated as single-ended or differential (En_Se_Clk in FIG. 1). Accordingly, those circuits within receiver 20 that receive the clock input(s) may receive the En_Se_Clk signal. In some embodiments, if there is more than one ClkIn input and corresponding data signal groups, the differential or single-ended nature of the inputs may be selected on a ClkIn and data group basis. In such embodiments, there may be multiple En_Se_D and En_Se_Clk signals coupled to respective groups of receiver circuits. The receiver circuits 20 may also receive the $V_{Ref}$ input as shown in FIG. 1 for the single-ended signals.

In some embodiments, the En_Se_D signal and the En_Se_Clk signal may be fixed (e.g., tied up or down) based on memory 12 that is included in the system with integrated circuit 10. In other embodiments, the En_Se_D signal and the En_Se_Clk signal may be programmable via software (e.g., in a register that may source the signals).

Receiver circuits 20 may use these enable signals to adjust delay through the receiver circuits, attempting to approximately match delay for differential signals (e.g., enable deasserted) and single-ended signals (e.g., enable asserted). That is, receiver circuits 20 may attempt to receive and transmit single-ended inputs more rapidly, to match a more rapid reception of the differential inputs. In some embodiments, by matching the delay, timing margin reserved for skew management between data and clock signals may be reduced.

For example, referring again to FIG. 1, Data In signals are provided by receiver circuits 20 to memory controller 18, and more particularly may be input to a register 24. The received ClkIn may be the clock input to the register 24. If the delay is approximately the same for single-ended and differential inputs, the skew between the data and the clock may be limited to approximately the skew permitted on the input interface. It is noted that, on double data rate interfaces, data is transferred in response to both the rising edge and the falling edge of the clock. Register 24 may thus represent one or more registers that can be triggered on the rising edge and/or the falling edge of the clock. In general, register 24 may comprise any one or more clocked storage devices (e.g., registers, flops, latches, etc.) or the like.

Still referring to FIG. 1, memory controller 18 may include the circuitry to communicate with memory 12. Additionally, memory controller 18 may include circuitry to communicate with other components within core 16. For example, memory controller 18 may include buffers or queues to store memory requests until they can be transmitted to memory 12, arbitration and prioritization logic to select among requests to be presented to memory 12, etc.

Memory 12 may comprise any type of memory. For example, in some embodiments, the memory may be synchronous dynamic random access memory (SDRAM) that complies with the mDDR2 standard (mDDR2 SDRAM). Any other form of synchronous or asynchronous DRAM may be used. Additionally, static RAM may be used, or flash memory or any other volatile or non-volatile memory. In one implementation, one or more memory modules, each containing one or more mDDR2 DRAM chips, may be used to form memory 12.

Core circuitry 16 may generally include circuitry that implements various logical operations that integrated circuit 10 is designed to perform. For example, if the design includes one or more processors, core circuitry 16 may include circuitry that implements the processor operation (e.g., instruction fetch, decode, execution, and result write, etc.). Such processors may include general purpose processors and/or graphics processors in various embodiments. If the design includes a bridge to a peripheral interface, for example, core circuitry 16 may include the circuitry that implements the bridge operation. If the design includes other communication features such as packet interfaces, network interfaces, etc., core circuitry 16 may include circuitry implementing the corresponding features. Integrated circuit 10 may generally be designed to provide any set of operations. Generally, core circuitry 16 may comprise any combination of one or more of the following: memory arrays, combinatorial logic, state machines, flops, registers, other clocked storage devices, custom logic circuits, etc.

While a memory interface is used as an example in which a mixture of differential and single-ended inputs may be supported, other embodiments may have any interface or receiver circuit in which a mixture of differential and single-ended inputs are included. In some embodiments, receiver circuits 20 described herein may be used to provide approximately equal propagation delays for single-ended and differential inputs through individual receiver circuits 20A-Z of receiver 20. In other embodiments, however, receiver circuits 20A-Z may be used to purposefully introduce and/or maintain a timing difference between various types of signals. Additionally, other embodiments may implement more than one memory controller and more than one memory. For example, more than one memory may be coupled to the same memory controller, and thus there may be more than one input channel coupled to the same memory controller.

In some embodiments, the system shown in FIG. 1 may be employed in microprocessors, microcontrollers, memories, systems-on-a-chip (SoCs), application-specific integrated circuits (ASICs)—or any other type of digital or analog IC, as well as microelectromechanical systems (MEMS). Examples of electronic devices that may include one or more ICs designed using the techniques described herein include, but are not limited to, desktop computers, laptop computers, tablets, network appliances, mobile phones, personal digital assistants (PDAs), global positioning systems (GPS), e-book readers, televisions, video game consoles, electronic control units, appliances, or any other electronic devices. As such, peripherals 22 may provide additional functionality for the system, depending on the nature of the system and its intended operation. For example, peripheral devices 22 may include various communications devices, devices for audio and video playback, user interface devices (e.g., touch screen, microphone, keyboard, etc.), general I/O interfaces such as universal serial bus (USB), etc.

Illustrative Receiver Circuits

Figure 3:
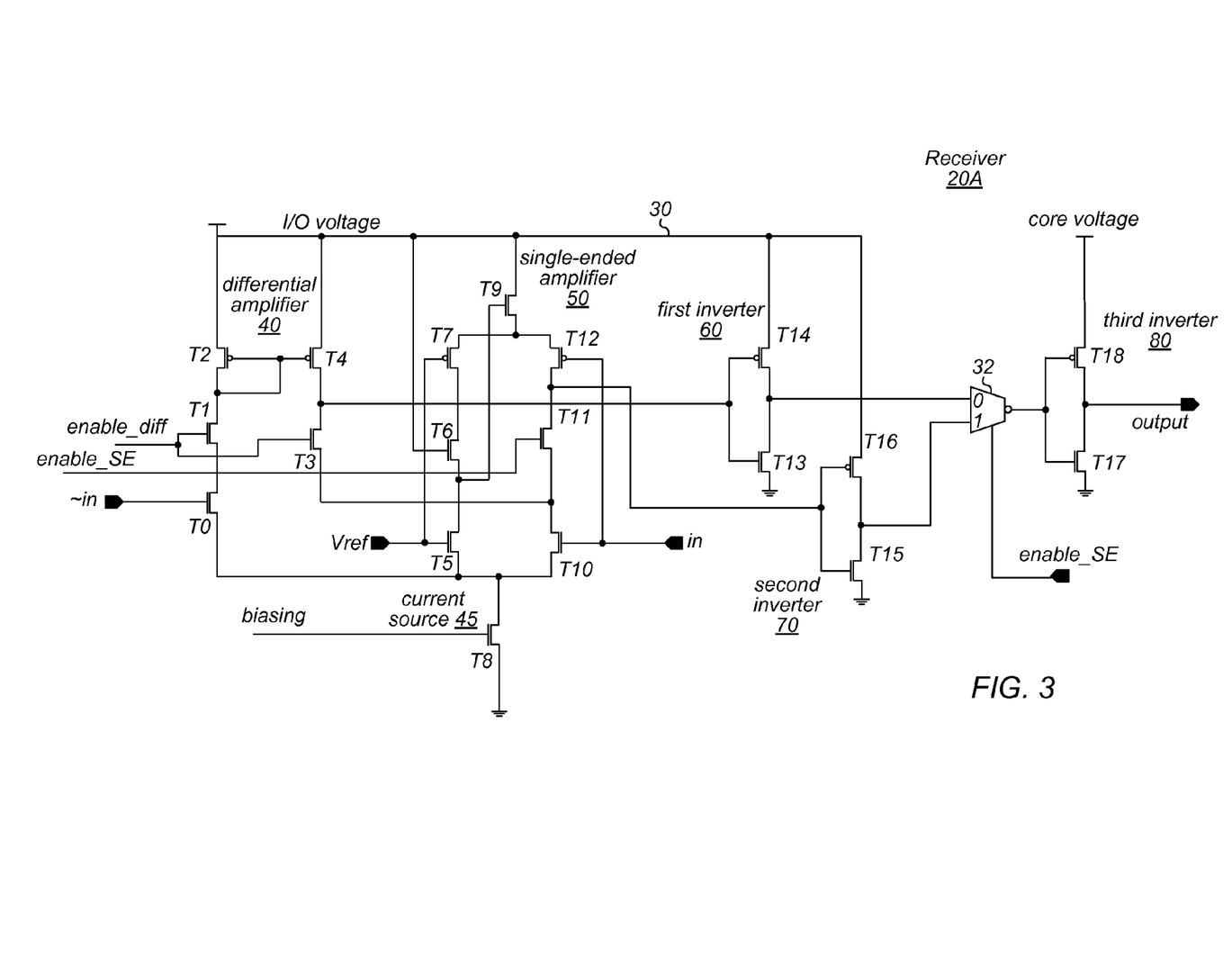
FIG. 3 is a diagram of a receiver circuit according to some embodiments.

Turning now to FIG. 3, a circuit diagram of an instance of a receiver circuit 20A-Z within receiver 20 is shown according to some embodiments. As illustrated, receiver circuit 20A may include various n-type MOS (NMOS) transistors and p-type MOS (PMOS) transistors. The standard symbols for NMOS transistors (no open circle on the gate terminal, such as the transistor T0) and PMOS transistors (open circle on the gate terminal, such as transistor T2) are used. Thus, in the embodiment as shown, T0, T1, T3, T5, T6, T8, T10, T11, T13, T15, and T17 are NMOS transistors and T2, T4, T7, T9, T12, T14, T16, and T18 are PMOS transistors.

Supply conductor 30 may be powered to voltage $V_{IO}$ during use. In some embodiments, $V_{IO}$ may be the voltage used on the interface to the memory (or at least may be a voltage that is compatible with the communication on the interconnect). In other embodiments, conductor 30 may be powered to the $V_{core}$ voltage used by the core 16, and may perform a level-shifting function on the input as well. In other embodiments, the $V_{core}$ and $V_{IO}$ voltages may be equal. Supply conductor 30 is designed to carry a relatively stable voltage (as opposed to signal conductors, which carry signals that vary to covey information). While the voltage on conductor 30 may be subject to variation during use (e.g., voltage droop during high current conditions, noise, etc.), conductor 30 is otherwise nominally held at the desired voltage. For example, conductor 30 may be electrically connected to the $V_{IO}$ input pins of integrated circuit 10. Meanwhile, the output of receiver circuit 20A may swing between $V_{SS}$ (e.g., "ground" in FIG. 3) and core voltage $V_{core}$.

As illustrated, receiver circuit 20A includes a first, differential amplifier 40. Generally, differential amplifier 40 may be enabled by applying an "enable_diff" signal to the gates of transistors T1 and T3. Meanwhile, the inputs to differential amplifier 40 may be applied to the gate of transistor T10 ("in") and to the gate of transistor T0 ("~in"). As noted above, input signals "in" and "~in" may be complementary to each other. For example, in some embodiments, "in" and "~in" may provide a differential clock or data signal. As such, the output of differential amplifier 40 may be responsive to the voltage difference between "in" and "~in;" that is, the output of differential amplifier 40 may indicate whether or not the "in" signal is greater than "~in." The sources of transistors T0 and T10 are connected to each other and to current source 45, which provides a current for the differential amplifier 40 and the single-ended amplifier 50. A bias circuit (not shown) may provide the biasing voltage designed to bias current source 45 to provide sufficient current to provide appropriate duty cycle control for the input(s) in differential mode (i.e., approximately matching rise delay and fall delay on the output of the receiver circuit 20A).

Transistors T2 and T4 may provide a current mirroring operation, mirroring a pulldown current in transistor T0 to a pullup current on the transistor T4, T3, T10 leg of the input stage. If the input is differential and is transmitting a binary one, the "in" signal transitions high and the "~in" signal transitions low. Transistor T10 is therefore active and is pulling down the output node between T3 and T4. The low transition of the "~in" signal decreases current in transistor T0 (and may turn off the transistor T0, if the "~in" signal swings to within a threshold voltage of $V_{SS}$). Thus, the pullup current through the transistor T4 decreases. The output of differential amplifier 40 is provided at the node between the drains of transistors T3 and T4 and may therefore transition low. Accordingly, the differential amplifier 40 is inverting in this embodiment. In other embodiments, the output may be provided form the node between the transistors T1 and T2, and receiver circuit 20A may be non-inverting. Conversely, if the input is transmitting a binary zero, the "in" signal transitions low and the "~in" signal transitions high. Current through transistor T0 (and thus through transistor T4) increases, and the current through transistor T10 decreases. The output of differential amplifier 40 may thus transition high.

The output node of differential amplifier 40 (i.e., the node between transistors T3 and T4) may be coupled to first inverter 60 that includes transistors T13 and T14, and the output of first inverter 60 (i.e., the node between the drains of transistors T13 and T14) may be coupled to a first input of inverting multiplexer 32. Also, the output of inverting multiplexer 32 may be coupled to third inverter 80 that includes transistors T17 and T18. The output to memory controller 18 is provided at the node connecting the drains of transistors T17 and T18 at third inverter 80.

Still referring to FIG. 3, receiver 20A may also include single-ended amplifier 50. Generally, single-ended amplifier 50 may be engaged upon application of "enable_SE" signal to the gate of transistor T11. In operation, single-ended amplifier 50 may receive as inputs "$V_{ref}$" and "in" at the gates of T5 and T10, respectively. As such, single-ended amplifier 50 and differential amplifier 40 share between them a common input and its corresponding transistor (i.e., transistor T10). The output of single-ended amplifier 50 may be coupled to second inverter 70 including transistors T15 and T16, and the output of second inverter 70 may be coupled to a second input of inverting multiplexer 32. Again, the output of inverting multiplexer 32 may be coupled to third inverter 80 that includes transistors T17 and T18.

In a single-ended mode of operation, transistor T5 has its gate coupled to an approximately fixed voltage ($V_{Ref}$). The current through T5 is essentially fixed, and thus the current through the transistor T12 is also essentially fixed. If input signal "in" is lower than $V_{Ref}$, the current through transistor T10 is less than the current through transistor T12 and the output will be high. If input signal "in" is higher than $V_{Ref}$, the current through transistor T10 is greater than transistor T12 and the output will go low. In this embodiment, the transistors T5-T7 may be active even in differential mode to maintain a current flow through the current source 45. The current flow may ensure that the current source 45 remains in saturation at all times. Similarly as in the differential case, the receiver is also inverting in this embodiment for the single-ended case. Moreover, if the same amount of current is supplied by current source 45, the delay through receiver 20A will be longer when operating in single-ended mode than in differential mode.

Accordingly, in some embodiments the "beta ratio" (i.e., the ratio between the strength or size of the PMOS device and the strength or size of the NMOS device) of the first and/or second inverters 60 and 70 may be selected such that, whether receiver circuit 20A is operating in differential or single-ended mode, the delay of the input signal (or signals) through the circuit is approximately the same. For example, a higher beta ratio in first inverter 60 may be used to increase a tripping point of first inverter 60 and thus the propagation of a low to high transition through the first inverter 60 may be slowed. Meanwhile, a lower beta ratio in second inverter 70 may be used to lower a tripping point of second inverter 70 and "speed up" a single-ended signal transition from low to high.

As illustrated, "enable_SE" is used to allow inverting multiplexer 32 to select one of its inputs (i.e., the output of differential amplifier 40 as processed by first inverter 60 or the output of single-ended amplifier 50 as processed by second inverter 70). In some embodiments, enabling signals "enable_SE" and "enable_diff" may be the inverse of each other, such that at any time during its operation, receiver 20A will be either in "single-ended mode" or "differential mode," as described above with respect to "En_Se_D" shown in FIG. 1. In other embodiments, however, "enable_SE" and "enable_diff" may be independent signals which, when both are absent, may allow receiver 20A to remain idle. It is noted that other variations of receiver circuit 20 are possible. For example, current source 45 may be connected between $V_{IO}$ conductor 30 using PMOS transistors instead of NMOS transistors, etc.

As described above, receiver circuit 20A may be viewed as having a differential mode and a single-ended mode, where the mode is selected via the one or more enabling signals (e.g., "enable_SE" and "enable_diff"). By providing one receiver circuit with two modes and selecting the mode based on the input type, a single receiver circuit may be used for all inputs and the correct mode may be selected based on whether the individual input is single-ended or differential. In some embodiments, receiver 20 includes instances 20A-Z of the same circuit shown in FIG. 3, therefore simplifying the timing characteristics of receiver 20.

Figure 4:
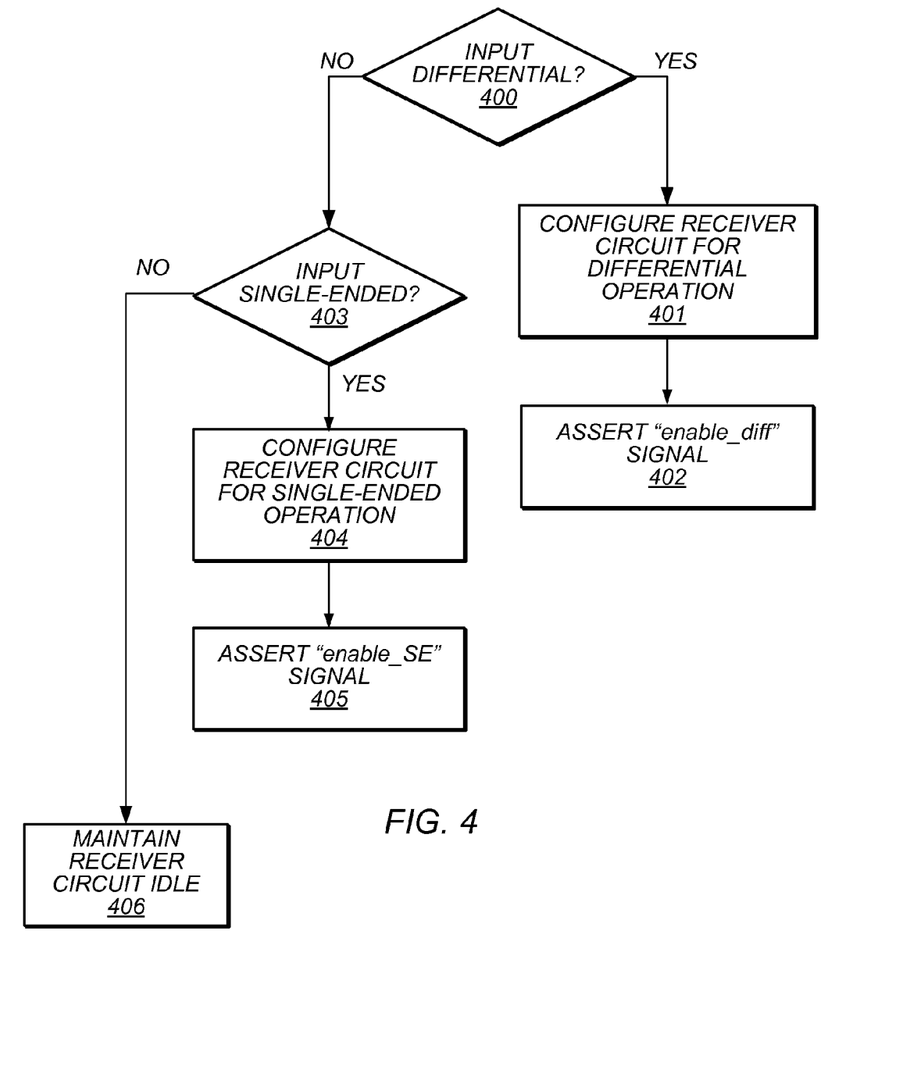
FIG. 4 is a flowchart of a method according to some embodiments.

Turning now to FIG. 4, a flowchart is shown illustrating a method according to some embodiments. While blocks 401-406 are shown in a particular order for ease of understanding, other orders may be used. In some embodiments, blocks 401-406 may be performed in parallel in combinatorial logic circuitry in the integrated circuit 10 and/or receiver 20. In other embodiments, combinations of blocks 401-406 and/or the flowchart as a whole may be pipelined over one or more clock cycles.

For each input to receiver 20, a particular receiver circuit 20A may be configured for single-ended or differential operation. At 400, the method determines whether the input to a particular receiver circuit is differential (e.g., a differential clock or data signal). If so, at 401 the method may configure that particular receiver circuit for differential operation. For example, at 402, the method may assert the "enable_diff" signal to the gates of transistors T1 and T3. Otherwise, at 403, the method determines if the input is single-ended. If so, the method may configure that particular receiver circuit for single-ended operation at 404. For example, at 405, the method may assert the "enable_SE" signal to the gate of transistor T11 as well as to inverting multiplexer 32. Otherwise, at 406, the method may maintain the particular receiver circuit idle.

Generally, integrated circuit 10, and more specifically the memory controller 18, may determine that input interface be idle if there is no data to be received from the memory 12. For example, the memory 12 may have a known latency for read operations, and the memory controller 18 may be able to determine when data is ready to be read based on the latency and the previously issued read commands. The input interface may be idle otherwise. Alternatively, the memory controller 18 may determine that data will be received when a read command is transmitted, and may wait until all outstanding reads are complete before determining that there is no data to be received. If the input interface is not idle, memory controller 18 may assert one or more of "enable_SE" and "enable_diff" to each appropriate receiver circuit 20A-Z. If the input interface is idle, however, memory controller 18 may deassert these enabling signals to each receiver circuit 20A-Z

An Illustrative System

Figure 5:
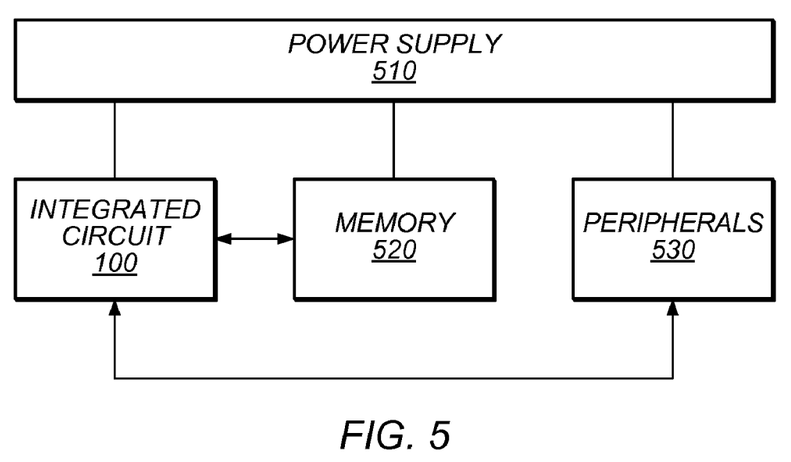
FIG. 5 is a block diagram of a system according to some embodiments.

In some embodiments, a system may incorporate embodiments of the above described integrated circuit. Turning next to FIG. 5, a block diagram of such system is shown. As illustrated, system 500 includes at least one instance of integrated circuit 10. In some embodiments, integrated circuit 10 may be a system-on-chip (SoC) or application specific integrated circuit (ASIC) including one or more instances of core circuit 16, memory controller 18, driver circuits 14, receiver circuits 20 etc. Integrated circuit 10 is coupled to one or more peripherals 530 (e.g., peripheral devices 22) and external memory (e.g., memory 12). For example, integrated circuit 10 may include one driver for communicating signals to external memory 520 and another driver for communicating signals to peripherals 530. Power supply 510 is also provided which supplies the supply voltages to integrated circuit 10 as well as one or more supply voltages to memory 520 and/or peripherals 530. In some embodiments, more than one instance of integrated circuit 10 may be included (and more than one external memory 520 may be included as well).

Peripherals 530 may include any desired circuitry, depending on the type of system 500. For example, in an embodiment, system 500 may be a mobile device (e.g., personal digital assistant (PDA), smart phone, etc.) and peripherals 530 may include devices for various types of wireless communication, such as Wi-Fi™, Bluetooth®, cellular, global positioning system, etc. Peripherals 530 may also include additional storage, including RAM storage, solid state storage, or disk storage. Peripherals 530 may include user interface devices such as a display screen, including touch display screens or multi-touch display screens, keyboard or other input devices, microphones, speakers, etc. In other embodiments, system 500 may be any type of computing system (e.g., desktop and laptop computers, tablets, network appliances, mobile phones, personal digital assistants, e-book readers, televisions, and game consoles).

External memory 520 may include any type of memory. For example, external memory 520 may include SRAM, non-volatile RAM (NVRAM, such as "flash" memory), and/or dynamic RAM (DRAM) such as synchronous DRAM (SDRAM), double data rate (DDR, DDR2, DDR3, etc.) SDRAM, Rambus® DRAM, etc. External memory 520 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

The invention claimed is:

1. A receiver circuit comprising:
a first amplifier configured to receive a first signal of a differential pair of signals at a first input and a second signal of the differential pair of signals at a second input in a differential mode; and
a second amplifier coupled to the first amplifier, wherein the second amplifier is configured to receive a reference signal at a third input and a single-ended signal at the first input in a single-ended mode, and wherein the second amplifier is configured, in the differential mode, to provide current flow through a transistor having a gate coupled to receive the reference signal, the current passing through a current source used by the first amplifier.

2. The receiver circuit of claim 1, wherein the second amplifier is configured to engage in the differential or single-ended modes in response to an enabling signal.

3. The receiver circuit of claim 1, further comprising an inverter circuit coupled to an output of the first amplifier, wherein the inverter circuit has a beta ratio selected to make a delay of the differential pair of signals and a delay of the single-ended signal approximately the same through the receiver.

4. The receiver circuit of claim 1, further comprising an inverter circuit coupled to an output of the second amplifier, wherein the inverter circuit has a beta ratio selected to make a delay of the differential pair of signals and a delay of the single-ended signal approximately the same through the receiver.

5. The receiver circuit of claim 1, further comprising a first inverter circuit coupled to an output of the first amplifier and a second inverter circuit coupled to an output of the second amplifier, wherein the first inverter circuit has a first beta ratio and the second inverter circuit has a second beta ratio, and wherein the first and second beta ratios are selected to approximately synchronize a delay of the differential pair of signals and the single-ended signal.

6. The receiver circuit of claim 5, further comprising an inverting multiplexer coupled to the first and second inverters, wherein the inverting multiplexer is configured to select an output of the first or second inverters.

7. The receiver circuit of claim 6, further comprising a third inverter circuit coupled to an output of the inverting multiplexer.

8. An integrated circuit comprising:
a plurality of receiver circuits, wherein each of the plurality of receiver circuits is capable of receiving a differential signal and a single-ended signal, and wherein each of the plurality of receiver circuits includes:
a first amplifier configured to receive the differential signal at a first input and a second input in response to a selection of a differential mode of operation; and
a second amplifier coupled to the first amplifier, wherein the second amplifier is configured to receive a reference signal at a third input and a single-ended signal at the first input in response to a selection of a single-ended mode of operation, wherein the first input is shared by the second amplifier and the first amplifier, wherein the differential signal received by a first receiver circuit of the plurality of receiver circuits is a clock signal and the single-ended signal received by a second receiver circuit of the plurality of receiver circuits is a data signal referenced to the clock signal.

9. The integrated circuit of claim 8, wherein each of the plurality of receiver circuits further comprises a first inverter circuit coupled to an output of the first amplifier and a second inverter circuit coupled to the second amplifier.

10. The integrated circuit of claim 9, wherein a first beta ratio of the first inverter and a second beta ratio of the second inverter are configured to make a delay of the differential signal through the first receiver circuit and the single-ended signal through the second receiver circuit approximately the same.

11. A method comprising:
providing a receiver circuit including:
a differential amplifier configured to receive a first signal of a differential pair of signals at a first input and a second signal of the differential pair of signals at a second input in response to a selection of a differential mode of operation;

a first inverter circuit coupled to an output of the differential amplifier;

a second amplifier coupled to the differential amplifier, wherein the second amplifier is configured to receive a reference signal at a third input and a single-ended signal at the first input in response to a selection of a single-ended mode of operation, and wherein the second amplifier is configured, in the differential mode, to provide current flow through a transistor having a gate coupled to receive the reference signal, the current passing through a current source used by the differential amplifier; and a second inverter coupled to an output of the second amplifier; and setting a beta ratio of at least one of the first or second inverter circuits to adjust a delay of at least one of the differential pair of signals or the single-ended signal.

12. The method of claim 11, wherein setting the beta ratio includes making a propagation time of the differential pair of signals and a propagation time of the single-ended signal through the receiver circuit approximately the same in the respective modes of operation.

13. The method of claim 11, wherein setting the beta ratio includes selecting a size of the at least one of the first or second inverter circuits.

14. The method of claim 11, further comprising repeating said providing and said setting for another receiver circuit placed in parallel with the receiver circuit.

15. In a circuit having a plurality of receiver circuits, each of the plurality of receiver circuits including a differential amplifier and a single-ended amplifier, wherein each of the plurality of receiver circuits includes a first transistor having a gate terminal coupled to receive a first signal, and wherein the first transistor is shared between the differential amplifier and the single-ended amplifier, a method comprising:

configuring a first receiver circuit of the plurality of receiver circuits for differential operation, wherein the first signal is one of a differential pair representing the input to the first receiver circuit;

the single-ended amplifier in the first receiver circuit providing current, in differential operation, through a transistor having a gate coupled to receive a reference voltage for single-ended operation, the current passing through a current source used by the differential amplifier;

configuring a second receiver circuit of the plurality of receiver circuits for single-ended mode, wherein the first signal is the single-ended input to the second receiver circuit and the second receiver circuit is further coupled to receive the reference voltage to which the single-ended input is referenced;

wherein a first delay of the differential pair through the first receiver circuit is approximately the same as a second delay of the single-ended input through the second receiver circuit.

16. The method of claim 15, further comprising:

selecting a first beta ratio of a first inverter coupled to the differential amplifier within the first receiver circuit to provide the first delay of the differential pair through the first receiver circuit.

17. The method of claim 16, further comprising:

selecting a second beta ratio of a second inverter coupled to the single-ended amplifier within the second receiver circuit to provide the second delay of the single-ended input through the second receiver circuit.

18. An integrated circuit comprising:

a plurality of receiver circuits, wherein each of the plurality of receiver circuits is capable of receiving a differential signal and a single-ended signal, and wherein each of the plurality of receiver circuits includes:

a first amplifier configured to receive the differential signal at a first input and a second input in response to a selection of a differential mode of operation; and a second amplifier coupled to the first amplifier, wherein the second amplifier is configured to receive a reference signal at a third input and a single-ended signal at the first input in response to a selection of a single-ended mode of operation, wherein the first input is shared by the second amplifier and the first amplifier, wherein the differential signal received by a first receiver circuit of the plurality of receiver circuits is a data signal and the single-ended signal received by a second receiver circuit of the plurality of receiver circuits is a clock signal to which the data signal is referenced.

19. The integrated circuit of claim 18, wherein each of the plurality of receiver circuits further comprises a first inverter circuit coupled to an output of the first amplifier and a second inverter circuit coupled to the second amplifier.

20. The integrated circuit of claim 19, wherein a first beta ratio of the first inverter and a second beta ratio of the second inverter are configured to make a delay of the differential signal through the first receiver circuit and the single-ended signal through the second receiver circuit approximately the same.

* * * * *